United States Patent
Chang et al.

(10) Patent No.: US 8,518,628 B2
(45) Date of Patent: Aug. 27, 2013

(54) SURFACE SWITCHABLE PHOTORESIST

(75) Inventors: Ching-Yu Chang, Yilang (TW); Chih-Cheng Chiu, Taipei County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1242 days.

(21) Appl. No.: 11/534,289

(22) Filed: Sep. 22, 2006

(65) Prior Publication Data
US 2008/0076038 A1    Mar. 27, 2008

(51) Int. Cl.
*G03F 7/038* (2006.01)
*G03F 7/039* (2006.01)

(52) U.S. Cl.
USPC ........ 430/270.1; 430/907; 430/910; 430/942; 430/311; 430/326

(58) Field of Classification Search
None
See application file for complete search history.

(56) References Cited

U.S. PATENT DOCUMENTS

| | | | | |
|---|---|---|---|---|
| 5,212,047 | A * | 5/1993 | Hertler et al. | 430/270.1 |
| 5,658,706 | A * | 8/1997 | Niki et al. | 430/270.1 |
| 6,153,349 | A | 11/2000 | Ichikawa et al. | |
| 6,713,236 | B2 | 3/2004 | Chen | |
| 6,781,670 | B2 | 8/2004 | Krautschik | |
| 6,788,477 | B2 | 9/2004 | Lin | |
| 6,828,079 | B2 | 12/2004 | Suetsugu et al. | |
| 6,849,378 | B2 | 2/2005 | Choi et al. | |
| 6,929,891 | B2 | 8/2005 | Rushkin et al. | |
| 7,264,918 | B2 | 9/2007 | Endo et al. | |
| 7,927,779 | B2 | 4/2011 | Chang et al. | |
| 2003/0186161 | A1 | 10/2003 | Fujimori | |
| 2004/0224257 | A1 * | 11/2004 | Shibuya | 430/270.1 |
| 2004/0259029 | A1 | 12/2004 | Nagahara et al. | |
| 2004/0259373 | A1 * | 12/2004 | Nagahara et al. | 438/745 |
| 2004/0265747 | A1 | 12/2004 | Medeiros et al. | |
| 2005/0007570 | A1 | 1/2005 | Streefkerk et al. | |
| 2005/0029492 | A1 | 2/2005 | Subawalla et al. | |
| 2005/0036183 | A1 | 2/2005 | Yeo et al. | |
| 2005/0051930 | A1 | 3/2005 | Kawakami et al. | |
| 2005/0084794 | A1 | 4/2005 | Meagley et al. | |
| 2005/0106499 | A1 | 5/2005 | Harada et al. | |
| 2005/0202340 | A1 | 9/2005 | Houlihan et al. | |
| 2005/0202351 | A1 | 9/2005 | Houlihan et al. | |
| 2005/0221234 | A1 | 10/2005 | Ito | |
| 2005/0243291 | A1 | 11/2005 | Kim | |
| 2005/0255414 | A1 | 11/2005 | Inabe et al. | |
| 2005/0277056 | A1 | 12/2005 | Kim et al. | |
| 2006/0007419 | A1 | 1/2006 | Streefkerk et al. | |
| 2006/0008736 | A1 * | 1/2006 | Kanda et al. | 430/270.1 |
| 2006/0008747 | A1 | 1/2006 | Kawamura et al. | |
| 2006/0068318 | A1 | 3/2006 | Meagley et al. | |
| 2006/0111550 | A1 | 5/2006 | Hata et al. | |
| 2006/0154170 | A1 | 7/2006 | Endo et al. | |
| 2007/0002296 | A1 | 1/2007 | Chang | |
| 2007/0016639 | A1 | 1/2007 | Mukundan et al. | |
| 2007/0031760 | A1 | 2/2007 | Chang et al. | |
| 2007/0077517 | A1 | 4/2007 | Chang | |
| 2007/0254235 | A1 * | 11/2007 | Allen et al. | 430/270.1 |

FOREIGN PATENT DOCUMENTS

| | | |
|---|---|---|
| CN | 1235281 | 11/1999 |
| CN | 1407405 | 4/2003 |
| EP | 1033624 | 9/1999 |
| EP | 1522894 | 4/2005 |
| EP | 1601008 | 11/2005 |
| EP | 1662323 | 5/2006 |
| JP | 07134419 | 5/1995 |
| JP | 07146558 | 6/1995 |
| JP | 1997160244 | 6/1997 |
| JP | 2001109142 | 4/2001 |
| JP | 2001337448 | 12/2001 |
| JP | 2003140360 | 5/2003 |
| JP | 2003167345 | 6/2003 |
| JP | 2005081302 | 3/2005 |
| JP | 2005101487 | 4/2005 |
| JP | 2005101498 | 4/2005 |
| JP | 2005128455 | 5/2005 |
| JP | 2005157259 | 6/2005 |
| JP | 2005264131 | 9/2005 |
| JP | 2006024692 | 1/2006 |
| JP | 2006048029 | 2/2006 |
| JP | 2006124957 | 5/2006 |
| JP | 2006157228 | 6/2006 |
| JP | 2006198897 | 8/2006 |
| JP | 2006276851 | 10/2006 |
| JP | 2006309245 | 11/2006 |
| JP | 2007219472 | 8/2007 |
| JP | 2007304537 | 11/2007 |

(Continued)

OTHER PUBLICATIONS

Japanese Office Action, Office Action of Nov. 24, 2009, Application No. 2007-146915, 12 pages.
French Patent Office, Office Action issued Jun. 22, 2010, Application No. 0608609, 8 pages.
Israeli Patent Office, Office Action of Feb. 9, 2010, Application No. 178317, 2 pages (English translation 2 pages).
Taiwanese Patent Office, Office Action dated May 19, 2010, Application No. 200910150015.5, 5 pages.
European Patent Office, Novelty Search Report dated Apr. 10, 2007, Dutch patent application No. 1032276, 9 pages.
Japanese Patent Office, Notification of Reasons for Refusal of Jan. 13, 2009, Application 2006-186926, 12 pages.
European Patent Office, Novelty Search Report dated Jun. 28, 2006, Dutch patent application No. 1032068, 5 pages.
Japanese Patent Office, Office Action dated Jul. 6, 2009, Application No. 2006212576, 4 pages, (English translation, 3 pages).
Chinese Patent Office, Office Action dated Jun. 26, 2009, Application No. 2006101524283, 4 pages.
Chinese Patent Office, Office Action dated May 22, 2009, Application No. 2006101524298, 5 pages.

(Continued)

*Primary Examiner* — Sin J. Lee
(74) *Attorney, Agent, or Firm* — Haynes and Boone, LLP (57) ABSTRACT

A material is provided for use in an immersion lithographic process of a semiconductor substrate. The material includes a photo-sensitive polymer configured to turn soluble to a base solution in response to reaction with an acid and at least one of either a base soluble polymer or an acid labile polymer. The base soluble polymer is configured to turn soluble to water in response to reaction with a developer solution. The acid labile polymer is configured to turn soluble to water after releasing a leaving group in reaction to the acid.

8 Claims, 5 Drawing Sheets

(56) References Cited

FOREIGN PATENT DOCUMENTS

| | | |
|---|---|---|
| JP | 2007304545 | 11/2007 |
| TW | 581930 | 4/2004 |
| TW | 233539 | 6/2005 |
| TW | 200613433 | 5/2006 |
| WO | WO-0291084 | 5/2002 |
| WO | WO-2004079800 | 9/2004 |
| WO | WO-2004081666 | 9/2004 |
| WO | WO-2004088429 | 10/2004 |
| WO | WO-2005019937 | 3/2005 |
| WO | WO-2005024325 | 3/2005 |
| WO | WO-2005081063 | 9/2005 |
| WO | WO-2005088397 | 9/2005 |
| WO | WO-2005013007 | 10/2005 |

OTHER PUBLICATIONS

German Patent Office, Office Action dated Apr. 15, 2009, Application No. 102006046453.2-51, 8 pages (English translation, 9 pages).

Jung, et al., Top Antireflective Coating process for Immersion Lithography, Advances in Resist Technology and Processing XXII, Proceedings of SPIE vol. 5753, Bellingham, WA, pp. 519-526.

Japanese Patent Office, Office Action dated Nov. 9, 2009, Application No. 2006212576, 2 pages.

Chinese Patent Office, Office Action dated Dec. 11, 2009, Application No. 2006101524283, 63 pages.

Japanese Patent Office, Office Action dated Sep. 28, 2010, Application No. 2007-146915. 3 page.

Taiwanese Patent Office, Office Action mailed Aug. 17, 2010, Application No. 095128606, 5 pages.

Taiwanese Patent Office, Office Action mailed Nov. 24, 2010, Application No. 095128606, 4 pages.

Taiwanese Patent Office, Office Action dated Mar. 2, 2011, Application No. 096114844, 5 pages.

U.S. Patent Office, U.S. Appl. No. 13/177,741, filed Jul. 7, 2011, 12 pages.

* cited by examiner

SURFACE SWITCHABLE PHOTORESIST

BACKGROUND

The present disclosure relates generally to resist materials, such as can be used in immersion or non-immersion photolithography, or other processes used in the manufacture of semiconductor integrated circuits.

Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Currently, CDs are reaching 65 nanometers and less.

Semiconductor photolithography typically includes the steps of applying a coating of photoresist (also referred to as resist) on a top surface (e.g., a thin film stack) of a semiconductor wafer and exposing the photoresist to a pattern. The semiconductor wafer is then transferred to a developing chamber to remove the exposed resist, which is soluble to an aqueous developer solution (commonly referred to as "developer"). As a result, a patterned layer of photoresist exists on the top surface of the wafer.

Immersion lithography is a new advance in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features. It is understood that the present disclosure is not limited to immersion lithography, but immersion lithography provides an example of a semiconductor process that can benefit from the invention described in greater detail below.

The immersion exposure step may use de-ionized water or another suitable immersion exposure fluid in the space between the wafer and the lens. Though the exposure time is short, the fluid can cause heretofore unforeseen problems. For example, droplets from the fluid can remain after the process and can adversely affect the patterning, critical dimensions, and other aspects of the resist.

One solution to help reduce defects, such as watermark defects, is to use a top coat layer on the resist layer. One such example is shown in U.S. Pub. No. 2006/111550, which is hereby incorporated by reference. However, the addition of a top coat layer provides additional concerns, and adds an additional layer to the entire process which increases overall production cost.

This application is related to U.S. application Ser. No. 11/324,588 filed Jan. 3, 2006 entitled, "Novel TARC Material for Immersion Watermark Reduction", which is hereby incorporated by reference.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the fabrication of semiconductor devices, and more particularly, to a method and system for preventing defects in a semiconductor substrate. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

The following disclosure is separated into three sections. The first section describes an example of a lithography process that can benefit from one or more embodiments of the present invention. The second section describes how a switchable polymer layer used in the lithography process discussed above reacts and changes during the lithography process. The second section also discusses various benefits from the different embodiments, it being understood that additional and/or different benefits may further exist in other embodiments of the present invention. The third section describes several different embodiments of switchable polymer material that can be used to create the switchable polymer layer.

The Lithography Process

Figure 1:
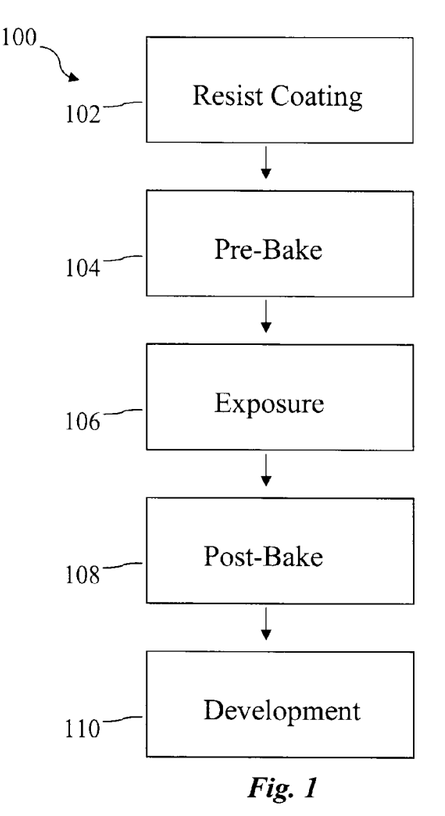
FIG. 1 is a flow chart of a method for implementing a lithography process with reduced defects, according to one or more embodiments of the present invention.

Referring to FIG. 1, a simplified flowchart of a method for lithography with a reduced number of defects is designated with the reference numeral 100. The lithography method 100 is but one example of a process that can benefit from one or more embodiments of the present invention. In furtherance of the present example, the lithography method 100 will be described as an immersion lithography process. The method 100 will further be discussed and illustrated with FIGS. 2-4 to show an example wafer 200 being processed by the method. The wafer 200 includes a substrate 212, which may further include one or more layers, including poly, metal, and/or dielectric, that are desired to be patterned.

Figure 2:
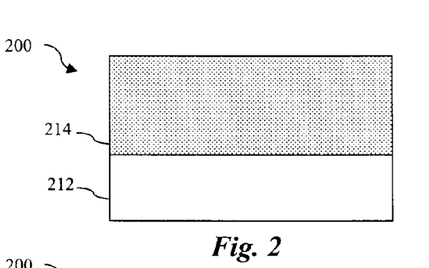
FIGS. 2-4 are side cross-sectional views of a semiconductor wafer that is being processed by the method of FIG. 1.

Referring to FIGS. 1 and 2, the immersion lithography method 100 begins at step 102, where the wafer substrate 212 is coated with a layer of resist 214. The resist 214 is a two- or multi-component resist system. The application of the resist 214 may be done with spin-coating or another suitable procedure. Prior to the application of the resist, the substrate 212 may be first processed to prepare it for the photolithography process. For example, the wafer 200 may be cleaned, dried and/or coated with an adhesion-promoting material prior to the application of the resist. At least a portion of the resist 214 includes switchable polymer material for creating a switchable polymer layer. Example characteristics and compositions of the switchable polymer layer are discussed in greater detail in the following two sections.

Figure 3:
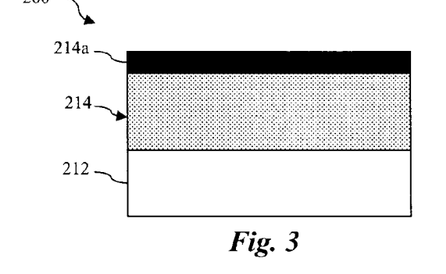

Referring to FIGS. 1 and 3, the immersion lithography method 100 proceeds to step 104, where a pre-bake process is performed. The wafer may be heated to a temperature of about 85 to about 150° C. for about 30 to about 200 seconds, for example. As shown in FIG. 3, switchable polymer material moves, diffuses, or is otherwise formed in an area of the resist 214 opposite to the substrate 212. For the sake of further description, the area of the resist 214 in which the switchable polymer material resides is referred to as the switchable polymer layer 214*a*.

The immersion lithography method 100 proceeds to step 106, where an immersion lithography exposure is performed. The wafer 200, including the resist 214, are immersed in an immersion exposure liquid (e.g., deionized water) and exposed to a radiation source through the lens (FIG. 2). The radiation source may be an ultraviolet light source, for example a krypton fluoride (KrF, 248 nm), argon fluoride (ArF, 193 nm), F2 (157 nm), extreme ultra-violet (EUV, 13.5 nm) and e-beam laser. The resist 214 is exposed to the radiation for a predetermined amount of time, dependent on the type of resist used, the intensity of the ultraviolet light source, and/or other factors. The exposure time may last from about 0.2 seconds to about 30 seconds, for example. The exposure results in portions of the resist becoming solid, while other portions remaining in a fluid state. It is understood that a negative resist can also be used, with inherent differences. Following the exposure process, one or more treatment process may be performed to help reduce the number of water droplets or other defects that may arise.

The immersion lithography method 100 proceeds to step 108, where the wafer 200 with the exposed resist 214 is heated with a post-exposure bake (PEB) for polymer dissolution. This step lets any generated photo acid (or base) react with the polymer and facilitate the polymer dissolution. The wafer 200 may be heated to a temperature of about 85 to about 150° C. for about 30 to about 200 seconds, for example.

Figure 4:
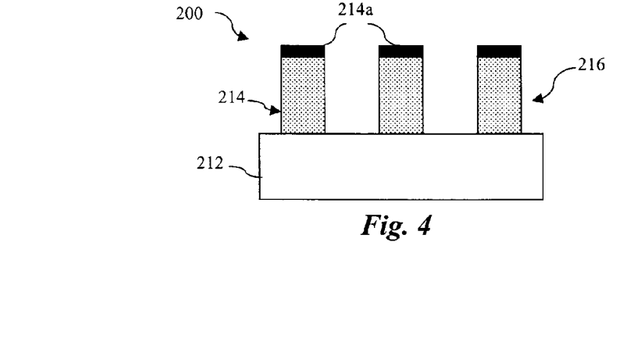

Referring to FIGS. 1 and 4, the immersion lithography method 100 proceeds to step 110, where a pattern developing process is performed on the exposed (positive) or unexposed (negative) resist 214 to leave a desired mask pattern 216. The wafer 200 is immersed in a developer solution ("developer") for a predetermined amount of time during which a portion of the resist 214 is dissolved and removed. The wafer 200 may be immersed in the developer solution for about 5 to about 60 seconds, for example. A separate, additional rinse may also be applied. After being immersed in the developer solution, the resist pattern surface loses about 50 A of its previous height, due to the removal of the switchable polymer layer. The composition of the developer solution is dependent on the composition of the resist, and is understood to be well known in the art. A base solution of 2.38% tetramethyl ammonium hydroxide (TMAH) is one example of a developer solution.

The Switchable Polymer Layer

Different embodiments of the switchable polymer layer can provide one or more benefits to the lithography operation described above. Several of these benefits are further discussed below. Additional benefits may also exist, and no particular benefit is required for every embodiment of the switchable polymer layer.

Figures 5, 6, 7, 8:
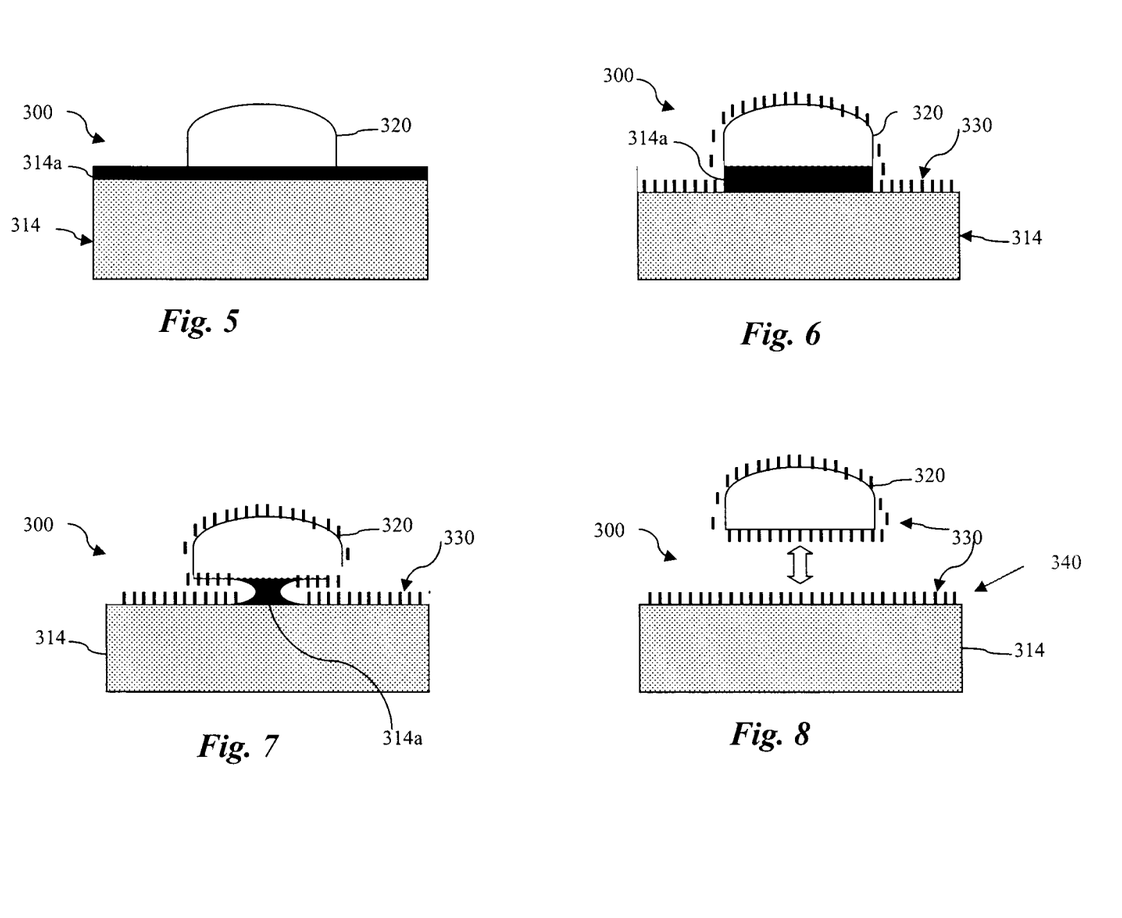
FIGS. 5-8 are side cross sectional views of a semiconductor wafer that is experiencing a benefit from at least one embodiment of the present invention.

Referring now to FIGS. 5-8, one benefit is that the switchable polymer layer helps to remove particles from the wafer's surface. In FIG. 5, a wafer 300 is shown having a resist layer 314. The resist layer 314 includes a switchable polymer layer 314*a* according to one or more embodiments of the present invention. The wafer has been through an immersion lithography process, and has a defect 320 on a top surface. The wafer is then provided to a development process, which is illustrated in FIGS. 6-8.

In FIG. 6, a developer solution 330 is applied over the top surface of the wafer. As shown in the figure, the developer solution 330 has already removed a portion of the switchable polymer layer 314*a* that was not immediately under the defect 320. As shown in FIG. 7, after an additional amount of time has transpired, the developer solution 330 has penetrated and removed more of the switchable polymer layer 314*a* that is under the defect 320. As shown in FIG. 8, eventually the switchable polymer layer 314*a* is sufficiently removed so that the defect 320 completely separates from the rest of the resist layer 314. The defect 320 can be washed away with the developer solution or a rinse, or removed by other means.

It is understood that although the resist layer 314 is not illustrated as having a specific pattern (like that shown in FIG. 4), the resist layer can indeed be patterned, and the present figures only show a small portion of a larger resist layer. The defect 320 can be on a solid portion of resist 314, or may cover several patterns and spaces of resist after the resist is developed. In both instances, the resulting patterned resist layer has reduced defects, as compared to a more conventional resist. It is also understood that although some of the switchable polymer layer 314*a* was removed by the developer 330, additional portions of the layer of switchable polymer material may still exist in the patterned and developed resist layer 314. The additional portions of the switchable polymer material can later be removed, such as through a water rinse operation. The defect 320 is surrounded with soluble polymer that has a good affinity to water, which makes it easy to remove.

There are several potential mechanisms that prevent the defect 320 from re-adhering to the surface of the resist 314. One mechanism is due to surface charging. Both the defect 320 and the resist layer 314 develop a common charge from an ionic group on the outer surface of each. The ionic charge may come from a surfactant in the developer, or the base developer used in the developing process. Since both charges are the same (e.g., negative), the defect 320 is naturally repelled from the resist layer 314. Another mechanism is that both the outer surface of the defect 320 and the outer surface of the resist 314 have hydrophilic polymer bonding. A hydrophilic group is attached to a polymer backbone on each surface, thereby discouraging bonding between the two groups of different surfaces. The hydrophilic polymer may come from a surfactant in the developer solution, or a developer polymer from the switchable polymer layer, or from another polymer produced during the development process. The resist surface 340 may become more hydrophilic than the resist surface 314*a*. The hydrophilic nature of the resist surface 340 will help to prevent the developing defect re-deposition and wafer surface watermark formation. For example, the resist surface 314*a* has an 85-degree contact angle, which becomes a 75-degree contact angle at the resist surface 340 after reacting with the developer solution. Another example is the resist surface 314a has an 85-degree contact angle and maintains this 85-degree contact angle at resist surface 340 after reacting with the developer solution.

Figure 9:
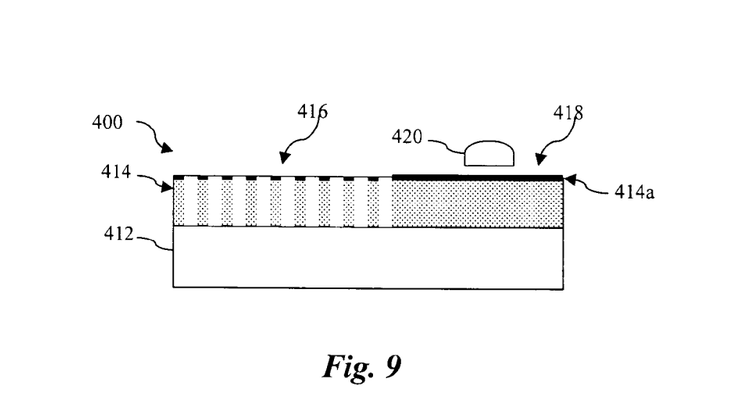
FIG. 9 is a side cross sectional view of a semiconductor wafer that is experiencing a benefit from another embodiment of the present invention.

Referring to FIG. 9, another benefit is that isolated pattern areas will be less likely to include a watermark defect. In one embodiment, a wafer 400 includes a substrate 412 having a resist layer 414. The resist layer 414 includes a switchable polymer layer 414a according to one or more embodiments of the present invention. As shown in the figure, there is a dense pattern area 416 and an isolated pattern area 418. With a conventional resist, the dense pattern area would be more hydrophilic, and the isolated pattern area would be more hydrophobic. However, by using the switchable polymer layer 414a, both areas 416, 418 have a more hydrophilic surface. That is, in addition to becoming soluble to (or after contact with) a TMAH developer solution, the switchable polymer layer 414a has become hydrophilic without the need of exposure. As a result, the hydrophilic nature of the isolation pattern area 418 encourages the removal of any watermark defect 420.

Figure 10:
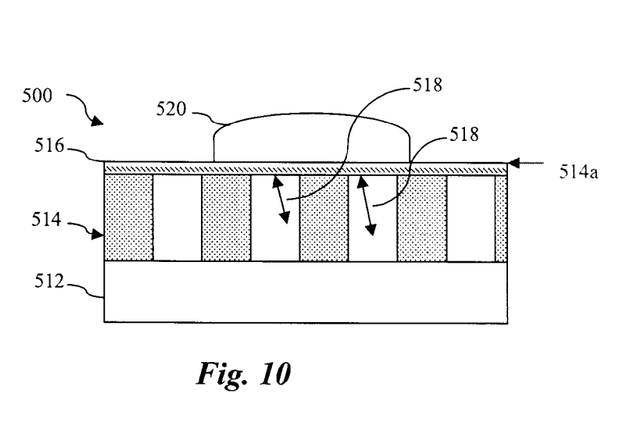
FIG. 10 is a side cross sectional view of a semiconductor wafer that is experiencing a benefit from yet another embodiment of the present invention.

Referring to FIG. 10, yet another benefit is that all pattern areas will be less likely to include a watermark defect. In one embodiment, a wafer 500 includes a substrate 512 having a resist layer 514. The resist layer 514 includes a switchable polymer layer 514a according to one or more embodiments of the present invention. The switchable polymer layer 514a contains an acid 516 which can prevent watermark formation. Exposed areas of the resist 514 are prevented from leaching (identified by arrows 518) to interact with a water drop 520, thereby further preventing watermark formation. The switchable polymer 514a can also rinse away from the top surface of the resist 514 to reduce the watermark defect and to also prevent any scum that would otherwise bridge over proximate non-exposed areas of resist that were, at one time, covered by the water drop 520.

Figure 11:
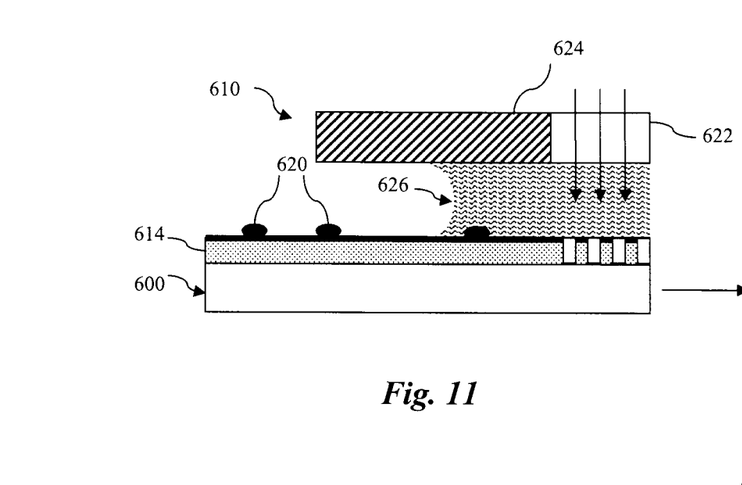
FIGS. 11-13 are side cross sectional views of a semiconductor wafer that is experiencing a benefit from another embodiment of the present invention, being used in an immersion lithography system.

Referring to FIG. 11, another benefit is that there are reduced defects that reside on a wafer surface from the immersion lithography process. For example, a wafer 600 can be provided to an immersion lithography system 610 for creating patterns on a resist layer 614 of the wafer. The resist layer 614 includes a switchable polymer layer 614a according to one or more embodiments of the present invention. The wafer 600 includes one or more wafer surface defects 620. The immersion lithography system includes a lens system 622, a structure 624 for containing a fluid 626 such as deionized water, various apertures 628 through which fluid can be added or removed, and a chuck 630 for securing and moving the wafer 600 relative to the lens system 622. The fluid containing structure 624 and the lens system 622 make up an immersion head. The immersion head can use some of the apertures as an "air purge," which can add air towards the wafer for drying, and other apertures for removing any purged fluid. Normally, any defects induced during the immersion process can dry in a few seconds time, and the drying would decrease the vacancy between the defects and resist surface, which is originally occupied with water. Such drying phenomena would increase the Vanderwaal forces and vacuum suck force between the defect and the resist, which make it very difficult to remove later by the immersion water.

Figure 12:
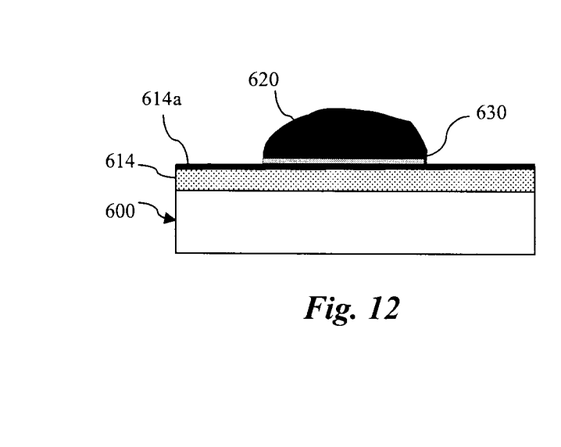
Figure 13:
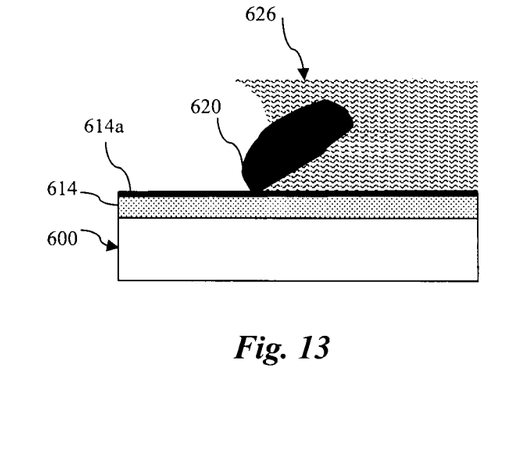

Referring also to FIGS. 12-13, in the present embodiment, the defect 620 starts to dry, but a surface 630 that is adjacent to the switchable polymer or high water-contain polymer layer 614a maintains a wet condition. The adjacent surface 630 has rich hydrogen bonding to water, which is hydrophilic and can be easily penetrated with the immersion fluid 626. As a result, the moisture interface of the surface 630 and immersion fluid 626 make the defect 620 more easily separable from the resist 614 and removable during the immersion lithography process.

The hydrogen bonding to water molecular, and the resulting hydrophilic surface or swelling polymer surface, can result from several factors. One factor is that the switchable polymer material includes a surfactant which can diffuse to the resist surface after applying the resist to the wafer surface or after baking the resist. The surfactant can achieve a low contact angle and absorb water/moisture between the defect 620 and the resist 614. Another factor is that the switchable polymer material includes a hydrogen bonding functional group which can absorb the immersion fluid 626 inside the resist surface. Another factor is that the switchable polymer layer that is water-rich (from the immersion fluid 626) has a thickness substantially more than 10 A, with a preferred thickness of about 150 A. Another factor is that the surface polymer material includes a hydrogen bonding functional group, which can absorb the immersion fluid 626 inside the resist surface.

Figure 14:
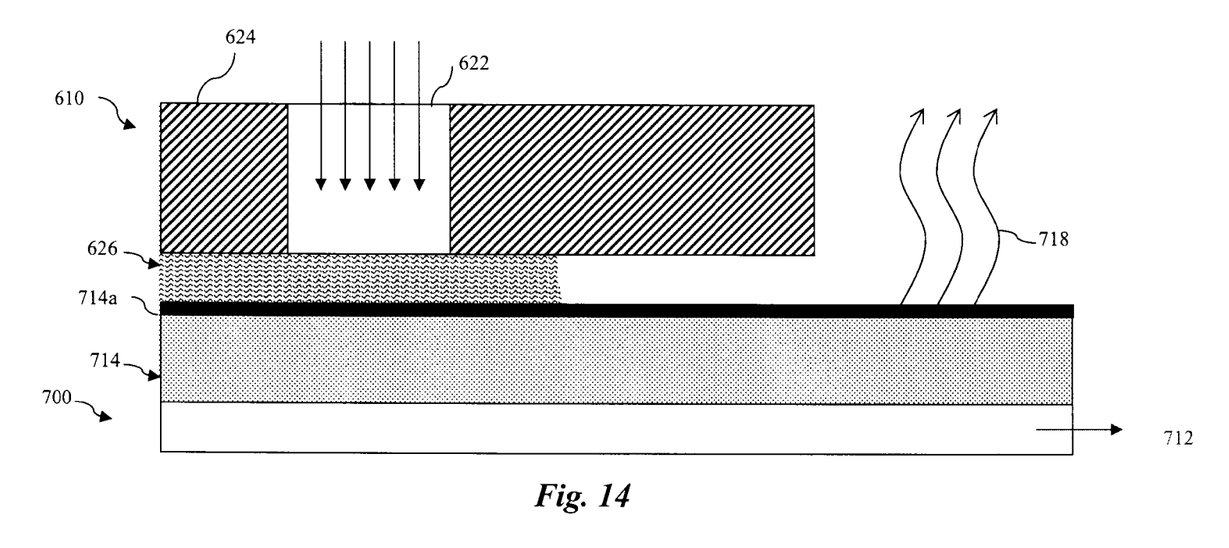
FIG. 14 is a side cross sectional view of a semiconductor wafer that is experiencing a benefit from yet another embodiment of the present invention, also being used in an immersion lithography system.

Referring to FIG. 14, another benefit is that there is reduced surface moisture in the resist after an immersion lithography process. For the sake of continued example, the immersion lithography system 610 of FIG. 11 is shown, as well as a wafer 700 including a substrate 712 and a resist layer 714. The resist layer 714 includes a switchable polymer layer 714a according to one or more embodiments of the present invention. After contact with the immersion fluid 626 (e.g., water) in the immersion head, the resist 714 contains a large amount of water. The absorbed water evaporates into the air, and such evaporation absorbs the resist heat and reduces the resist surface temperature. The local temperature change influences a focus sensor on the immersion head. However, in the present embodiment, the switchable polymer or hydrophilic polymer material provides a water-absorbing compound into the resist and traps the water with less evaporation and less thermal change after immersion water scanning. As a result, better focus control is provided to the focus sensor.

The Polymer Material

In the present embodiments, the resist (214, 314, 414, 514, 614, and/or 714) includes at least two types of material, a standard resist polymer material and a switchable polymer material. The standard resist polymer material turns soluble to a base solution in response to an acid. The standard resist polymer material may include a photo acid generator (PAG) to produce the acid, thereby supporting a chemical amplified reaction (CAR). CARs are often used in deep ultraviolet (UV) and deep submicron technologies. During lithography, a photon induces decomposition of the PAG and forms a small amount of acid. The formed acid induces a cascade of chemical transformations in the resist film, typically during a post-exposure bake step. It is understood that there are many other examples of resist, including those with a photo base generator (PBG). Also, whether the resist is positive resist or negative resist is a matter of design choice, but for the sake of further example, a positive resist with PAG will be described.

The switchable polymer material is an additive to the standard resist material, and includes properties that cause it to separate from at least some of the standard resist material and diffuse or move towards an upper surface (as shown in the drawings) of the resist during a preliminary process. The switchable polymer material also includes properties that are important to a later processing operation, such as being easily removed in response to a developer solution or water rinse, turning hydrophilic in a developer solution or turning hydrophilic in an immersion fluid. The resist surface may become hydrophilic after the switchable polymer is removed by developer. The resist surface may also become hydrophilic after developer with the remaining switchable polymer on it. The switchable polymer may have a different structure composition with gradient contact angle property on the resist surface, which can keep a high contact angle before being exposed to the developer solution and can become more hydrophilic after more switchable polymer is removed from the developer solution.

There are several ways that additive material can diffuse to the resist surface, one or more of which can be used, as a choice of design. One ways is due to a molecular weight difference. The switchable polymer material has a lower molecular weight than the resist material, which causes the polymer material to diffuse into the top area of the resist during the pre bake process. Another way is due to a polarity difference. The switchable polymer material has a different polarity, which causes the polymer material to diffuse into the top area of there resist during the pre bake process. For example, if the resist film is more non-polar as compared to the switchable polymer material, the two polarities of film will separate after thermal baking. Another way is a hydrophilic/hydrophobic difference. If the switchable polymer material has a different hydrophilic/hydrophobic ratio, the solubility to solvent or to each other will also different. The switchable polymer material will separate from other material during the thermal baking process. Yet another way is a difference in solubility to a solvent. If the switchable polymer material solubility to a solvent is higher than the resist polymer, then the additive polymer can diffuse into the top area of the resist along with the solvent during the pre bake process. Another way is due to polymer solubility. If the switchable polymer material and the resist material have different hydrogen bonding or Vanderwaal forces with each other, this difference will cause the two materials to separate after thermal baking.

In one embodiment, the switchable polymer is an acid labile polymer that will react, e.g., become soluble, after being exposed to a solution such as developer solution. The switchable polymer may be soluble to water, to the developer solution, or both. The switchable polymer turns soluble to water after releasing a leaving group in a reaction with an acid produced from the resist (PAG) or the developer solution. The acid labile polymer material can include base quenchers to diffuse into the resist to stop or significantly reduce photo acid generation in a CAR, such as during PEB.

Figure 15:
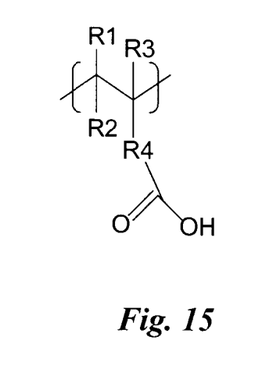
FIGS. 15-18 are chemical diagrams of a switchable polymer material for use in one or more embodiments of the present invention.
Figure 16:
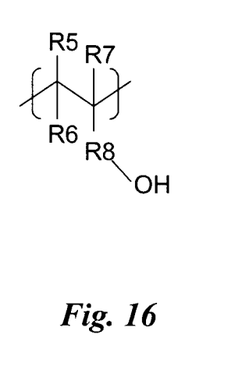
Figure 17:
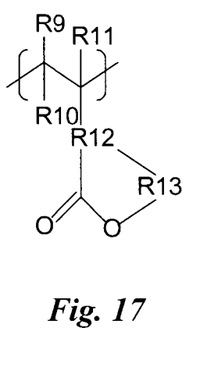
Figure 18:
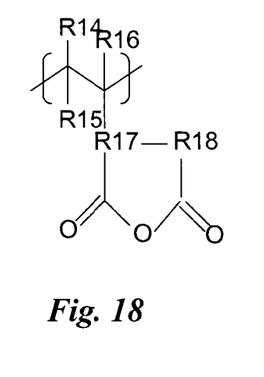

In another embodiment, the switchable polymer material is a base soluble polymer that becomes water soluble after reacting with a solution such as a developer solution. An example of a base soluble polymer is a carbonyl group such as provided in FIG. 15, where R1, R2 and R3 each are hydrogen, a fluorine atom or a straight, branched or cyclic alkyl or fluorinated alkyl group of 1 to 20 carbon atom, R4 is a straight, branched or cyclic alkyl or fluorinated alkyl group of 1 to 20 carbon atom. Another example of a base soluble polymer is a hydroxyl group such as provided in FIG. 16, where R5, R6 and R7 each are hydrogen, a fluorine atom or a straight, branched or cyclic alkyl or fluorinated alkyl group of 1 to 20 carbon atom. R8 is a straight, branched or cyclic alkyl or fluorinated alkyl group of 1 to 20 carbon atom. Another example of a base soluble polymer is a lactone group such as provided in FIG. 17, where R9, R10 and R11 each are hydrogen, a fluorine atom or a straight, branched or cyclic alkyl or fluorinated alkyl group of 1 to 20 carbon atom, R12 and R13 each are a straight, branched or cyclic alkyl or fluorinated alkyl group of 1 to 20. Another example of a base soluble polymer is an anhydride group such as provided in FIG. 18, where R14, R15 and R16 each are hydrogen, a fluorine atom or a straight, branched or cyclic alkyl or fluorinated alkyl group of 1 to 20 carbon atom, R17 and R18 each are a straight, branched or cyclic alkyl or fluorinated alkyl group of 1 to 20 carbon atom. The switchable polymer layer formed from the base soluble material can have a thickness between about 10 A to about 3000 A, with a preferred thickness between about 10 A and about 1000 A. Also, after developing, the overall reduction of height of the switchable polymer layer can be less than 500 A, and more preferably less than about 50 A or 30 A.

Additional examples of the switchable polymer material include:

Carboxylic polymer: $RCOOH + OH^- \Rightarrow RCOO^- + H_2O$;

Acid sensitive leaving group: $RCOOR1 + H^+ \Rightarrow RCOO-$;

Fluoride polymer: $RC(CF_3)_2OH + OH^- \Rightarrow RC(CF_3)_2O-$;

Hydroxyl contained polymer: $ROH + OH^- \Rightarrow RO-$, $ROH + H^+ \Rightarrow ROH_2+$; and     Lactones, anhydride contained polymer $RCOOR1 + OH1 \Rightarrow RCOO- + R1OH$.

Although only a few exemplary embodiments of this invention have been described in detail above, those skilled in the art will readily appreciate that many modifications are possible in the exemplary embodiments without materially departing from the novel teachings and advantages of this invention.

In one embodiment, a material is provided for use in lithographic process of a semiconductor substrate. The material includes a photo-sensitive polymer configured to turn soluble to a base solution in response to reaction with an acid and at least one of either a base soluble polymer, acid soluble polymer or an acid labile polymer. The base soluble polymer is configured to turn soluble to water in response to reaction with a developer solution. The acid soluble polymer is configured to turn soluble to water in response to a reaction with an acid solution. The acid labile polymer is configured to turn soluble to water after releasing a leaving group in reaction to the acid.

In some embodiments, the material further includes a photo acid generator configured to release the acid in response to optical exposure, and/or a quencher base for reacting with the acid.

In some embodiments, the acid labile polymer further comprises at least one of an adhesive group or an etching resistance group. In some embodiments, the base soluble polymer includes a polymer group of either a carbonyl group, a hydroxyl group, a lactone group, or an anhydride group.

In another embodiment, a method for performing lithography on a semiconductor substrate is provided. The method includes coating a resist on the substrate to a first height, performing a pre-exposure bake on the resist, exposing the resist-coated substrate, and developing the exposed substrate with a developing solution. During the pre-exposure bake, the resist is substantially separated into a first layer and a second layer. After developing, the resist has a second height of at least 50 A less than the first height.

In some embodiments, the step of coating the resist includes combining a first polymer material that does not become water soluble after being developed with the developing solution, and a second polymer material that does become water soluble after being developed with the developing solution.

In another embodiment, a resist material for use with a substrate is provided. The resist includes a first polymer material and a second polymer material. The first polymer material is configured to diffuse from the second material and towards an exterior surface of the substrate during a baking operation.

The first polymer material is also configured to change properties when exposed to a solution.

In some embodiments, the first polymer material is configured to become more hydrophilic when exposed to an immersion fluid used in an immersion lithography system.

In some embodiments, the first polymer material is configured to become more water-soluble when exposed to a developing solution.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

We claim:

1. A resist material for use in lithography, comprising:
a resist polymer configured to turn soluble to a base solution in response to reaction with an acid;
a photo acid generator configured to release the acid in response to an exposure process; and
a switchable polymer having a structure that causes it to separate from the resist polymer and diffuse towards a surface of the resist material in response to a bake process, and that causes the surface of the resist material to become more hydrophilic in one of a developer solution and an immersion fluid;
wherein the switchable polymer includes a base soluble polymer configured to turn soluble to water in response to a reaction with a base developer solution, wherein the base soluble polymer has a dissolution rate that facilitates rapid removal of defects, and wherein the base soluble polymer includes one of:

or

R1, R2, and R3 are H and R4 is a fluorinated alkyl group of 1 to 20 carbon atoms; R5, R6, and R7 are H and R8 is a straight chain fluorinated alkyl group of 1 to 20 carbon atoms; R9 and R10 are H, R11 is H or a straight, branched, or cyclic alkyl group of 1 to 20 carbons, and R12 and R13 are a straight, branched, or cyclic alkyl or fluorinated alkyl group of 1 to 20 carbons; and R14 and R15 are H, and R16 is H or a straight, branched, or cyclic alkyl group of 1 to 20 carbons, and R17 and R18 are a straight, branched, or cyclic alkyl or fluorinated alkyl group of 1 to 20 carbons.

2. The material of claim 1, wherein the exposure is optical and of a wavelength from a group associated with KrF, ArF, extreme ultra-violet (EUV), and e-beam.

3. The material of claim 1 further comprising: a quencher base for reacting with the acid wherein the quencher base is configured to stop a chemical amplified reaction (CAR) during a post exposure baking step.

4. The material of claim 1 wherein the structure of the switchable polymer includes one of a lower molecular weight than the resist polymer, a different polarity from the resist polymer, a different hydrophobic/hydrophilic ratio from the resist polymer, a different solubility from the resist polymer, and a different hydrogen bonding from the resist polymer.

5. The material of claim 1 wherein at least a portion of the switchable polymer is removed from the resist material in the developer solution thereby causing the surface of the resist material to become more hydrophilic.

6. The material of claim 5, wherein reduction in height of the switchable polymer layer is less than about 400 A after the bake process and reaction with a base developer solution.

7. The material of claim 1, wherein the switchable polymer layer formed from the base soluble polymer has a thickness between about 10 A to about 1000 A.

8. The material of claim 7, wherein the switchable polymer layer has a thickness of about 150 A.

* * * * *